(12) United States Patent
Li et al.

(10) Patent No.: US 10,026,858 B2
(45) Date of Patent: *Jul. 17, 2018

(54) ADHESIVE TAPE AND SOLAR ASSEMBLY AND ARTICLE MADE THEREOF

(71) Applicant: 3M INNOVATIVE PROPERTIES COMPANY, Saint Paul, MN (US)

(72) Inventors: Jinbo Li, Shanghai (CN); Jie Zhou, Shanghai (CN); Rui Pan, Shanghai (CN); Jiayun Zhu, Shanghai (CN); Qisheng Pan, Shanghai (CN); Xianfeng Ji, Beijing (CN); Susannah C. Clear, Hastings, MN (US); Gregory A. Shipp, Madison, CT (US); Yingyu Wang, Shanghai (CN)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/330,948

(22) Filed: Apr. 11, 2016

(65) Prior Publication Data

US 2017/0222079 A1     Aug. 3, 2017

Related U.S. Application Data

(63) Continuation of application No. 13/985,604, filed as application No. PCT/US2012/024335 on Feb. 8, 2012, now Pat. No. 9,310,102.

(30) Foreign Application Priority Data

Feb. 18, 2011   (CN) .......................... 2011 1 0042671

(51) Int. Cl.
*H01L 31/048* (2014.01)
*C09J 7/02* (2006.01)

(52) U.S. Cl.
CPC .......... *H01L 31/0481* (2013.01); *C09J 7/025* (2013.01); *C09J 7/0257* (2013.01); *C09J 7/0278* (2013.01);
(Continued)

(58) Field of Classification Search
CPC ................ C09J 7/0264; C09J 2203/322; C09J 2423/006; C09J 2433/003; C09J 2433/006;
(Continued)

(56) References Cited

U.S. PATENT DOCUMENTS 6,036,997 A   3/2000  Ragland
6,287,685 B1  9/2001  Jannsen
(Continued)

FOREIGN PATENT DOCUMENTS

CN       2823258 Y     10/2006
CN       201000893     1/2008
(Continued)

OTHER PUBLICATIONS

International Search Report for PCT International Application No. PCT/US2012/024335, dated Oct. 24, 2012, 5 pages.
(Continued)

*Primary Examiner* — Betelhem Shewareged
(74) *Attorney, Agent, or Firm* — Eric D. Levinson

(57) ABSTRACT

The invention provides a frameless photo-energy assembly including a photo-energy converter, wherein an edge of the photo-energy converter is sealed by an adhesive tape, comprising an adhering layer for adhesion and cushioning; and an aging-resistant protective layer. The adhering layer is used to contact the edge of an article and comprises: a substrate layer; optionally, a first adhesive layer and a second adhesive layer situated at both sides of the substrate layer oppositely, wherein the first adhesive layer being used
(Continued)

to be contact with the article. The aging-resistant protective layer is situated on the adhering layer, which comprises: an optional primer layer, which is situated on the adhering layer; and a film layer, which is situated on either the primer layer or the substrate or the second adhesive layer. The invention further provides an adhesive tape for sealing an edge of an article and an article made of the assembly.

20 Claims, 5 Drawing Sheets

(52) U.S. Cl.
CPC ....... *C09J 7/0292* (2013.01); *C09J 2201/134* (2013.01); *C09J 2203/322* (2013.01); *C09J 2400/163* (2013.01); *C09J 2423/045* (2013.01); *C09J 2423/105* (2013.01); *C09J 2427/006* (2013.01); *C09J 2433/00* (2013.01); *C09J 2467/001* (2013.01); *Y10T 428/24802* (2015.01); *Y10T 428/24843* (2015.01); *Y10T 428/31678* (2015.04); *Y10T 428/31826* (2015.04); *Y10T 428/31855* (2015.04)

(58) Field of Classification Search
CPC ... F24J 2/465; H01L 31/04; Y10T 428/24802; Y10T 428/24843; Y10T 428/31678; Y10T 428/31826; Y10T 428/31855; Y02E 10/50; Y02E 10/40
See application file for complete search history.

(56) References Cited

U.S. PATENT DOCUMENTS

| | | | | |
|---|---|---|---|---|
| 9,310,102 | B2* | 4/2016 | Li | C09J 7/0264 |
| 2007/0259171 | A1 | 11/2007 | Keicher | |
| 2008/0041442 | A1 | 2/2008 | Hanoka | |
| 2009/0205703 | A1 | 8/2009 | Umotoy | |
| 2010/0065212 | A1 | 3/2010 | Husemann | |
| 2010/0300528 | A1 | 12/2010 | Fujii | |
| 2011/0030791 | A1 | 2/2011 | Snowwhite | |

FOREIGN PATENT DOCUMENTS

| | | |
|---|---|---|
| CN | 201072761 | 6/2008 |
| CN | 201307597 | 9/2009 |
| CN | 201508845 U | 6/2010 |
| CN | 101935500 | 1/2011 |
| DE | 202008011501 | 1/2009 |
| EP | 2256826 A2 | 12/2010 |
| JP | 2001-081915 | 3/2001 |
| JP | 2001-196621 A | 7/2001 |
| JP | 2010-278358 A | 12/2010 |
| JP | 2011-032451 | 2/2011 |
| WO | WO 2009-018258 | 2/2009 |
| WO | WO 2012-112361 | 8/2012 |

OTHER PUBLICATIONS

Database WPI Week 200156 Thomson Scientific, London, GB; AN 2001-505076, XP002685379.
English-language Abstract for CN2823258Y dated Oct. 4, 2006.
English-language Abstract for CN201000893 dated Jan. 2, 2008.
English-language Abstract for CN201072761 dated Jun. 11, 2008.
English-language Abstract for CN201307597 dated Sep. 9, 2009.
English-language Abstract for DE202008011501 dated Jan. 22, 2009.
English-language Abstract for JP2001-081915 dated Mar. 27, 2001.

\* cited by examiner

DESCRIPTION OF DRAWINGS
ADHESIVE TAPE AND SOLAR ASSEMBLY AND ARTICLE MADE THEREOF

CROSS-REFERENCE TO RELATED APPLICATIONS

Figure 1:
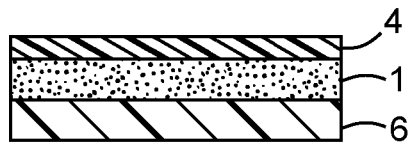

This application is a continuation of U.S. application Ser. No. 13/985,604, filed Aug. 15, 2013, which is a national stage filing under 35 U.S.C. 371 of International Application No. PCT/US2012/024335, filed Feb. 8, 2012, which claims priority to Chinese Application No. 201110042671.0, filed Feb. 18, 2011. The disclosures of all three applications are incorporated by reference in their entirety herein.

FIELD OF THE INVENTION

The present invention relates to the field of solar assembly manufacture, and specifically, to a protective adhesive tape for scaling an edge of a solar assembly, as well as a solar assembly and an article made thereof.

BACKGROUND ART

The existing solar laminated assemblies are mainly mounted and protected by an aluminum frame fixed and sealed by the silicone sealant or double faced foam adhesive tapes. The existing solar assemblies are formed by laminating a structure of multi-layers, and therefore, the material of protective layer for the assemblies are needed to have superior moisture-vapor transmission retardant (MVTR) performance and weather resistance. The edges of most of the existing assemblies are sealed and protected by an aluminum alloy frame and the silica gel or double faced foam adhesive tapes. However, in the application of the solar assemblies, not all of them need the aluminum alloy frame. For example, in the application of photovoltaic curtain wall, roof photovoltaic, photovoltaic street lamps or the like, the aluminum alloy frame will increase the weight and cost of the assemblies, and the mounting operation thereof is relatively complex.

Therefore, there is a demand for providing a product, such as an adhesive tape, which can be used as an alternative of the frame to seal the edges of the solar assemblies.

DISCLOSURE OF THE INVENTION

In order to overcome this problem, the inventors of the invention have designed an adhesive tape, which can, as an alternative of the frame, seal the edges of the solar assemblies, reduce the weight of the solar assemblies greatly, reduce the producing time because solidification is needless, provide convenient operation for sticking the adhesive tape by tools or apparatuses, and reduce the manufacturing cost.

According to the first aspect of the invention, there provides a frameless photo-energy assembly including a photo-energy converter, wherein an edge of the photo-energy converter is sealed by an adhesive tape. The adhesive tape includes an adhesive tape for sealing an edge of an article, comprising:
an adhering layer for adhesion and cushioning, which is used to contact the edge of an article and comprises:
a substrate layer;
optionally, a first adhesive layer and a second adhesive layer situated at both sides of the substrate layer oppositely, where-in the first adhesive layer being used to be contact with the article; and
an aging-resistant protective layer on the adhering layer, which comprises:
an optional primer layer, which is situated on the adhering layer; and
a film layer, which is situated on the primer layer.

According to the second aspect of the invention, there provides a solar article with a solar assembly as described above in the first aspect.

According to the third aspect of the invention, there provides an adhesive tape for sealing an edge of an article, comprising:
an adhering layer for adhesion and cushioning, which is used to contact the edge of an article and comprises:
a substrate layer;
optionally, a first adhesive layer and a second adhesive layer situated at both sides of the substrate layer oppositely, wherein the first adhesive layer being used to be contact with the article; and
an aging-resistant protective layer on the adhering layer, which comprises:
an optional primer layer, which is situated on the adhering layer; and
a film layer, which is situated on:
the primer layer, if any; or
the substrate layer, provided that the primer layer and the first and second adhesive layers are not provided; or
the second adhesive layer, if any, and provided that the primer layer is not provided.

The application of the adhesive tape of the invention can reduce the weight of the solar assemblies greatly, reduce the producing time because solidification is needless upon scaling, provide convenient operation for sticking the adhesive tape by tools or apparatuses, and reduce the manufacturing cost. According to demands, the material of the protective layer for the adhesive tape of the invention can have various functions, such as abrasion resistance, weather resistance, soiling resistance, or decorating performance or the like. Additionally, according to demands, the adhesive tape of the invention can further provide superior cushioning performance.

DESCRIPTION OF DRAWINGS

Figure 2:
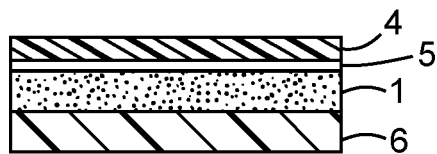
Figure 3:
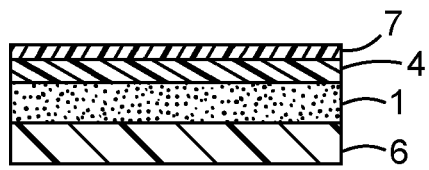
Figure 4:
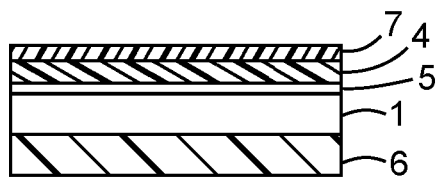
Figure 5:
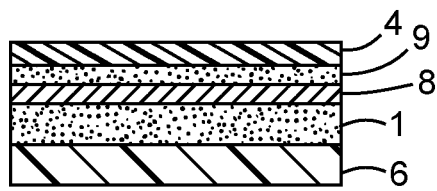
Figure 6:
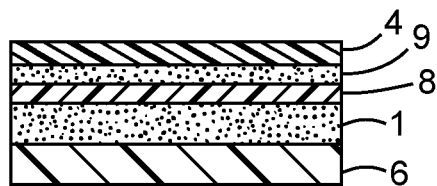
Figure 7:
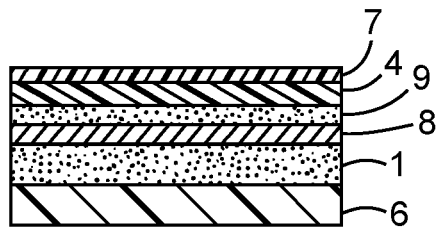
Figure 8:
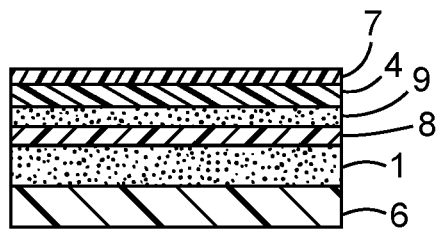
Figure 9:
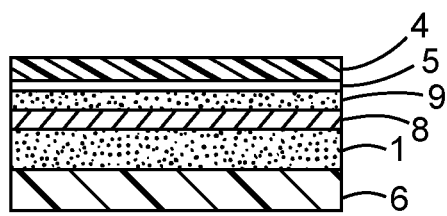
Figure 10:
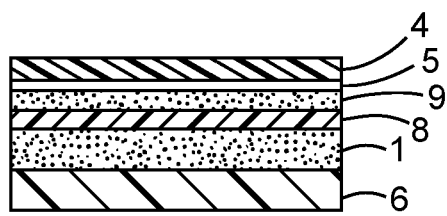
Figure 11:
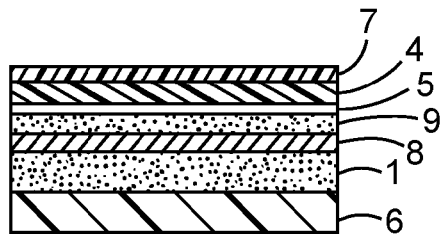
Figure 12:
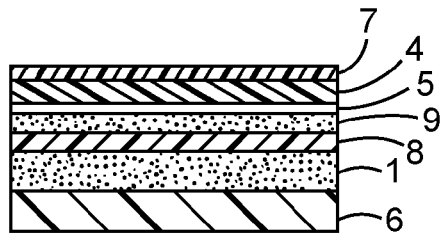
Figure 13:
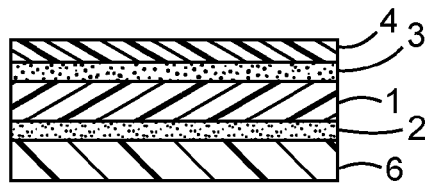
Figure 14:
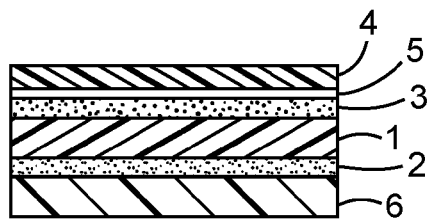
Figure 15:
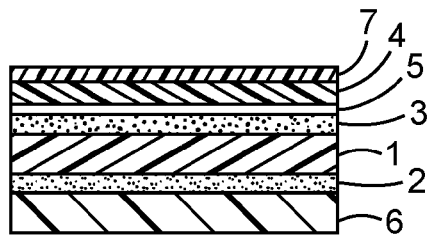
Figure 16:
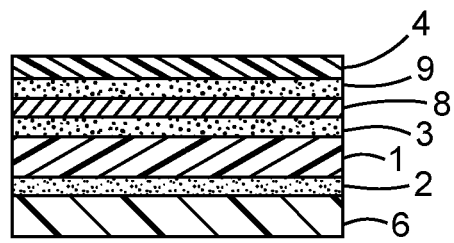
Figure 17:
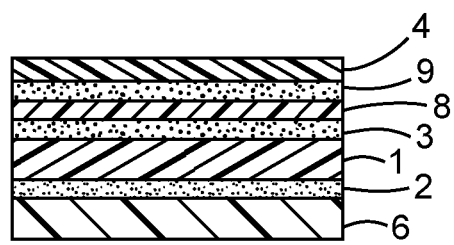
Figure 18:
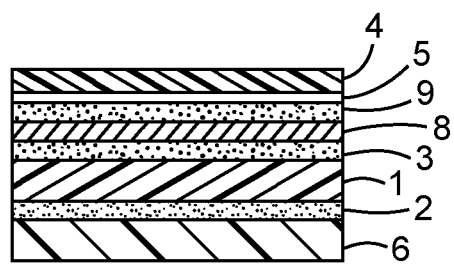
Figure 19:
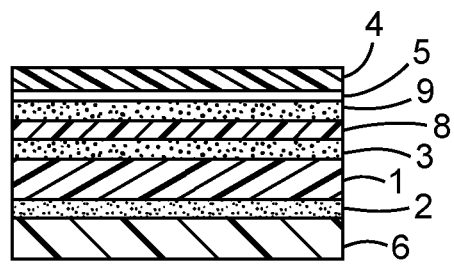
Figure 20:
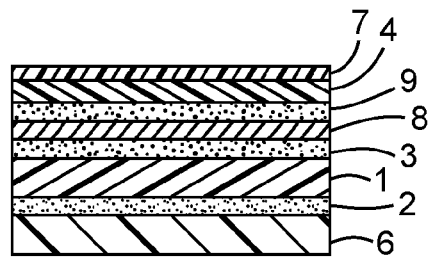
Figure 21:
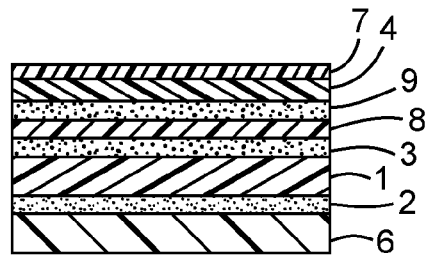
Figure 22:
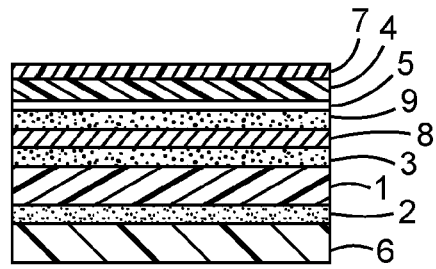
Figure 23:
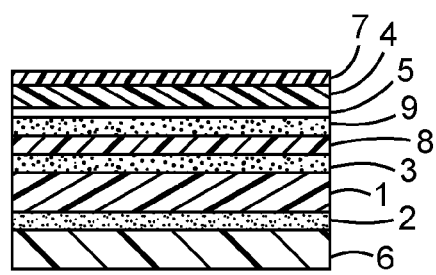

FIG. 1 is a structural schematic view of the cross section of an adhesive tape according to the example 1 of the invention;

FIG. 2 is a structural schematic view of the cross section of an adhesive tape according to the example 2 of the invention;

FIG. 3 is a structural schematic view of the cross section of an adhesive tape according to the example 3 of the invention;

FIG. 4 is a structural schematic view of the cross section of an adhesive tape according to the example 4 of the invention;

FIG. 5 is a structural schematic view of the cross section of an adhesive tape according to the example 5 of the invention;

FIG. 6 is a structural schematic view of the cross section of an adhesive tape according to the example 6 of the invention;

FIG. 7 is a structural schematic view of the cross section of an adhesive tape according to the example 7 of the invention;

FIG. 8 is a structural schematic view of the cross section of an adhesive tape according to the example 8 of the invention;

FIG. 9 is a structural schematic view of the cross section of an adhesive tape according to the example 9 of the invention;

FIG. 10 is a structural schematic view of the cross section of an adhesive tape according to the example 10 of the invention;

FIG. 11 is a structural schematic view of the cross section of an adhesive tape according to the example 11 of the invention;

FIG. 12 is a structural schematic view of the cross section of an adhesive tape according to the example 12 of the invention;

FIG. 13 is a structural schematic view of the cross section of an adhesive tape according to the example 13 of the invention;

FIG. 14 is a structural schematic view of the cross section of an adhesive tape according to the example 14 of the invention;

FIG. 15 is a structural schematic view of the cross section of an adhesive tape according to the example 15 of the invention;

FIG. 16 is a structural schematic view of the cross section of an adhesive tape according to the example 16 of the invention;

FIG. 17 is a structural schematic view of the cross section of an adhesive tape according to the example 17 of the invention;

FIG. 18 is a structural schematic view of the cross section of an adhesive tape according to the example 18 of the invention;

FIG. 19 is a structural schematic view of the cross section of an adhesive tape according to the example 19 of the invention;

FIG. 20 is a structural schematic view of the cross section of an adhesive tape according to the example 20 of the invention;

FIG. 21 is a structural schematic view of the cross section of an adhesive tape according to the example 21 of the invention;

FIG. 22 is a structural schematic view of the cross section of an adhesive tape according to the example 22 of the invention; and FIG. 23 is a structural schematic view of the cross section of an adhesive tape according to the example 23 of the invention.

Figure 24:
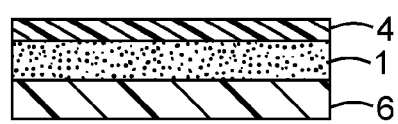

FIG. 24 is a structural schematic view of the cross section of an adhesive tape according to the example 24 of the invention.

The reference numbers in the drawings represent the followings respectively:

1: a substrate layer;
2: a first adhesive layer;
3: a second adhesive layer;
4: a film layer;
5: a primer layer;
6: a releasing film;
7: a top layer;
8: an intermediate layer;
9: a third adhesive layer.

SPECIFIC MODE OF CARRYING OUT THIS INVENTION

Unless specifically indicated, in the invention, the following terms have the following definitions:

The term "photothermal or photovoltaic assembly" (which are referred as "photo-energy assembly" herein) means a panel type assembly which can generate electricity or heat by utilizing photo-energy such as solar energy, including but not limited to a crystal silicon solar assembly, a non-crystal silicon thin film solar assembly, other thin film solar assemblies of CIGS [CuInxGa(1-x)Sc2, that is, thin film solar copper/indium/gallium/selenium] or the like, and a solar heat collector.

The term "solar article" means a product containing the solar assembly as described above, including but not limited to a solar vehicle, a solar water heater, a solar street lamp, or a solar curtain wall or the like.

The term "non-woven fabric" means a material composed of oriented or random macromolecular fibers.

The term "ACRYLIC adhesive" means an acrylic ester type press sensitive adhesive.

The term "hot melt adhesive" means an adhesive such as polyolefin block copolymers (SBS, SIS), ethylene-vinyl acetate copolymer (EVA) or the like, which is a solid at room temperature and can achieve adhesion in several minutes of pressing and cooling after being melt into a liquid by heating and coated on an article to be adhered.

The term "structural adhesive" means an adhesive of epoxy resin, polyurethane or the like, which has high strength, relatively large loading endurance, aging resistance, fatigue resistance, corrosion resistance, stable performance in predetermined life, and are applicable to the adhesion of the structures for bearing strong force.

The terms "foam" and "foaming material" have the same meaning in the invention, which mean a material such as polyethylene, polyurethane, acrylic acid or the like which has compressibility after foaming.

The term "foam adhesive" means an adhesive which provides an adhesive layer with bonding performance on one side or both sides of the "foam" and "foaming material" by using the above "foam" or "foaming material" as a substrate, so as to form a composite adhering material with compressibility and specific bonding performance.

The first aspect of the invention provides a frameless photo-energy assembly including a photo-energy converter, wherein an edge of the photo-energy converter is sealed by an adhesive tape comprising:
   an adhering layer for adhesion and cushioning, which is used to contact the edge of an article and comprises:
      a substrate layer; and
      optionally, a first adhesive layer and a second adhesive layer situated at both sides of the substrate layer oppositely, wherein the first adhesive layer being used to be contact with the article; and
   an aging-resistant protective layer on the adhering layer, which comprises:
      an optional primer layer, which is situated on the adhering layer; and
      a film layer, which is situated on:
         the primer layer, if any; or
         the substrate layer, provided that the primer layer and the first and second adhesive layers are not provided; or
         the second adhesive layer, if any, and provided that the primer layer is not provided.

The photo-energy assembly of the invention can be a photovoltaic or photothermal assembly, including, but not limited to, photovoltaic panel, a thin film photovoltaic panel, a photothermal panel or the like.

According to the second aspect of the invention, there provides a solar article with a solar assembly as described above in the first aspect. It includes, but not limited to, the articles of a solar vehicle, a solar water heater, a solar street lamp, or a solar curtain wall or the like.

According to the third aspect of the invention, there provides an adhesive tape for sealing an edge of an article, comprising:
an adhering layer for adhesion and cushioning, which is used to contact the edge of an article and comprises:
a substrate layer;
optionally, a first adhesive layer and a second adhesive layer situated at both sides of the substrate layer oppositely, where-in the first adhesive layer being used to be contact with the article; and
an aging-resistant protective layer on the adhering layer, which comprises:
an optional primer layer, which is situated on the adhering layer; and
a film layer, which is situated on the primer layer.

The adhering layer is preferably made of an adhesive for adhering layer with superior adhering performance and sealing performance.

According to some preferable embodiments, the adhesive tape of the invention further comprises a water-proof intermediate layer situated between the protective layer and the adhering layer. An adhesive may be required between the water-proof intermediate layer and the protective layer. The useful adhesives can be those listed above.

According to some preferable embodiments, the adhering layer in the adhesive tape used in the invention comprises:
a substrate layer;
a first adhesive layer and a second adhesive layer situated at both sides of the substrate layer oppositely, wherein the first adhesive layer being used to be contact with the article;
a water-proof intermediate layer situated between the second adhesive layer and the protective layer;
wherein the protective layer comprising:
a primer layer, which is situated on the adhering layer; and
a film layer, which is situated on the primer layer.

The protective layer of the adhesive tape in the photo-energy assembly of the invention has aging-resistant performance which satisfies the outdoor aging testing conditions and accelerated aging testing conditions, preferably:
a total irritation amount of 60 kWh/m$^2$ under the outdoor exposing condition according to IEC60721-2-1;
200 cycles for the high-low temperature cycle at −40° C.-+85° C. according to IEC61215; 10 cycles for the humidity freeze cycle at −40° C.-+85° C./85% RH according to IEC61215; 1000 hours for the high temperature-high humidity aging at +85° C./85% RH according to IEC61215; or the like.

After being subjected to the above typical aging conditions, the protective layer has no appearance defect of breakage, cleavage, tearing or the like, and thus, the appearance integrity of the solar assembly is stabilized and the original function characteristic of the assembly is maintained.

The aging resistant and appearance protective layer is made of a film or metal foil material which has relatively good aging resistance and flexibility, and preferably has superior moisture-vapor blocking and weather resistant performances. For example, according to some preferable embodiments, the film layer in the protective layer is preferably made of a material selected from the group consisting of unstabilized PTFE, PVDF, PVF, ETFE, ECTFE, THV and silicone rubbers. Other film layers with UV and degradation protection packages include PVDF/PMMA blends, block (e.g., Kuraray Kurarity polymers) or random PMMA/acrylate polymers, PMMA, impact-resistant PMMA, polyethylene-methacrylic acid ionomers (e.g., Dupont Surlyn), polyethylene-acrylic acid ionomers (e.g., Dupont Nucrel), crosslinked polyisobutylene, aliphatic polyurethanes, hydrogenated styrenic block copolymers, thermoplastic vulcanized rubber (e.g., Exxon Mobil Santoprene), crosslinked, ethylene propylene terpolymer, plasticized or unplasticized polyvinyl chloride, thermoplastic polyurethane rubber, polyimide, polyethylene, polypropylene, ionomer, or mixtures thereof. According to some other embodiments, the film layer can further be made of a metal foil such as an aluminum foil or a copper foil. Although the more preferable film layer is polyvinyl chloride, polypropylene can provide the desired functions such as UV resistant performance, flame retardant performance, impact resistant performance by using formulation additives. The film layer can further contain a top layer which can provide the desired functions, such as abrasion resistance, weather resistance, water-proof property, soiling resistance, or a decorative attribute. The top layer is a surface solidification treated layer which can be obtained by coating a polymer onto the surface of the base film. Coating examples may include spray coating, roller coating, gravure coating, and direct reverse gravure coating, optionally with radiative curing such as UV or e-beam. According to some further more preferable embodiments, the top layer is selected from the group consisting of an abrasion resistant coating, a weather resistant coating, a water-proof coating, a soiling resistant coating, or a decorative coating. As to the aging-resistant property of the material constituting the film layer, it generally can pass the IEC 61215 aging test or can be used outside for over 25 years. The protective layer preferably meets the requirements under outdoor exposing conditions according to IEC60721-2-1, can endure a total exposure dosage up to 60 kWh/m$^2$, and has the following ther-proof performances according to IEC61215: 200 cycles for the high-low temperature cycle at −40° C.-+85° C.; 10 cycles for the humidity freeze cycle at −40° C.-+85° C./85% RH; 1000 hours for the high temperature-high humidity aging at +85° C./85% RH; or the like.

According to some preferable embodiments, the primer layer in the adhesive tape of the invention is made of a material selected from the group consisting of silane coupling agents, polyolefins, polyvinyls, polyamides, isocyanates, or halogenated rubbers. According to some more preferable embodiments, the primer layer in the adhesive tape of the invention further contains a third adhesive layer. According to some further more preferable embodiments, the third adhesive layer is made of an adhesive selected from the group consisting of an ACRYLIC adhesive, a hot melt adhesive, a structural adhesive, a silicone based adhesive, or combinations thereof. The third layer is used to stick the film layer to the substrate layer or the intermediate layer. The primer layer is used to enhance the interlaminar bonding force between the film layer and the second adhesive layer. More preferably, the primer layer is generally formed by coating a mixed solution of a macromolecular polymer with a functional group (such as carboxyl group, amido group, hydroxyl group, tert-amino group, ester group primary amino group, primary amino group). According to some more preferable embodiments, the coating thickness of the primer layer is less than 0.05 mm. The primer layer can be formed by coating a primer coating agent such as "POLYMENT NK-350" (aminomethyl-modified resin available from Nippon Shokubai Kogyo Co, Ltd.), while the film layer can be made of black PVC such as Nan Ya Plastics Corp. 0.10 mm black PVC.

The adhering layer in the adhesive tape of the invention can provide good adhering performance and sealing performance. The 90 degree peel strength of the adhering layer from the surface of the solar assembly (glass, THV backing material, PVDF backing material, PVF backing material or the like) may be greater than 1 N/cm, which can effectively maintain the characteristic function of the solar assembly. An appropriate primer may be applied to the one or both surfaces of the solar assembly to promote adhesion. Typically, the adhering layer can pass the creepage test according to IEC61215-10-15. According to some preferable embodiments, the first adhesive layer in the adhesive tape of the invention is made of an adhesive selected from the group consisting of an ACRYLIC adhesive, a hot melt adhesive, a structural adhesive, or combinations thereof. According to some preferable embodiments, the second adhesive layer in the adhesive tape of the invention is made of an adhesive selected from the group consisting of an ACRYLIC adhesive, a silicon based adhesive, a rubber adhesive, a hot melt adhesive, a structural adhesive, or combinations thereof. According to these embodiments, the performance of the adhering layer should simultaneously satisfy the following outdoor aging testing conditions and accelerated aging testing conditions, specifically:

a total irritation amount of 60 kWh/m$^2$ under the outdoor exposing condition according to IEC60721-2-1;

200 cycles for the high-low temperature cycle at −40° C.-+85° C. according to IEC61215;

10 cycles for the humidity freeze cycle at −40° C.-+85° C./85% RH according to IEC61215; and 1000 hours for the high temperature-high humidity aging at +85° C./85% relative humidity according to IEC61215.

After being subjected to the above typical aging conditions, the 90 degree peel strength of the adhering layer from the surface of the solar assembly (glass, THY backing material, PVDF backing material, PVF backing material or the like) may be greater than 1 N/cm. Thus, it provides the solar assembly with an intact and stable sealing effect and simultaneously maintains the characteristic function of the solar assembly after aging. Typically, for example, it can pass the creepage test according to IEC61215-10-15.

According to some preferable embodiments, the second adhesive layer of the adhering layer is made of an adhesive selected from the group consisting of an ACRYLIC adhesive, a rubber adhesive or combinations thereof. The peel force between the second adhesive layer and the layer formed by the primer layer is above 1N/cm.

The bonding strength between the adhering layer and an article to be sealed is preferably above 1 N/cm in terms of 90 degree peel strength. The substrate layer of the adhering layer is preferably ACRYLIC foam, while the adhesive layer is preferably made of an ACRYLIC adhesive. For example, 3M 4941 VHB can be used as the adhering layer.

According to some more preferable embodiments, the substrate layer in the adhesive tape of the invention is composed of a material selected from the group consisting of a foamed material, an acrylic resin, polyurethane, a polyethylene rubber, a non-woven material, or mixtures thereof. For example, a material with certain cushioning performance, such as adhesives, foam, rubbers, non-woven fabric or the like with viscoelasticity and compressibility, can be used as the substrate layer. A material with high adhering performance can also be used as the substrate layer, such as, the 2081 acrylic foam adhesive tape from 3M Company.

In order to improve the water-proof performance of the adhesive tape, an intermediate layer can be further added into the product. For example, a material layer with 60 g/m$^2$/24 hr or less of relatively small moisture-vapor transmission ratio (37.8° C.), such as a metal layer, a butyl rubber layer, a surface-modified PET (polyethylene terephthalate) layer, a polyisobutylene polypropylene layer and a polyurethane layer or the like, can be added and used as a moisture-vapor blocking layer. According to some preferable embodiments, the intermediate layer is made of a material selected from the group consisting of a metal, a rubber, and polyurethane. According to some more preferable embodiments, the metal is selected from the group consisting of aluminum, copper or combinations thereof. According to some more preferable embodiments, the rubber is selected from the group consisting of ethylene propylene terpolymer, fluoroelastomer, polyisobutylene, or mixtures thereof. According to some preferable embodiments, the water-proof intermediate layer can pass the creepage test according to IEC61215 after being subjected to 10 cycles for the humidity freeze cycle at −40° C.-±85° C./85% relative humidity according to IEC61215; 1000 hours for the high temperature-high humidity aging at +85° C./85% relative humidity according to IEC61215. The water-proof intermediate layer can be made of a metal foil such as an aluminum foil and preferably has a thickness of 10-100 μm. For example, it can be made of 8011 aluminum foil from Alcoa with a thickness of 47 μm.

The thicknesses of respective material layers are not particularly limited and can be adjusted according to the different demands of specific products so as to realize the functions of material layers as described above. For example, the thicknesses are generally 0.01-100 mm.

According to some particularly preferable embodiments, the 90 degree peel strength between the adhesive tape used in the assembly of the invention and the article to be sealed is above 1 N/cm. The adhesive tape used in the assembly of the invention has the following weather-proof performances: a total irritation amount of 60 kWh/m$^2$ under the outdoor exposing condition according to IEC60721-2-1; 200 cycles for the high-low temperature cycle at −40° C.-+85° C. according to IEC61215; 10 cycles for the humidity freeze cycle at −40° C.-+85° C./85% relative humidity according to IEC61215; 1000 hours for the high temperature-high humidity aging at +85° C./85% relative humidity according to IEC61215. Before and after aging the tape should pass the creepage test according to IEC61215, and retain its water barrier performance. Preferably, the substrate layer is made of ACRYLIC foam and has a thickness of 0.2-2.0 mm, the first adhesive layer and the second adhesive layer are made of ACRYLIC adhesive and have a thickness of 10-100 μm, the water-proof intermediate layer is made of 8011 aluminum foil from Alcoa and has a thickness of 47 μm, the primer layer is made of a "POLYMENT 3M NK-350" primer coating agent and has a thickness of 0.005-0.05 mm; the film layer is made of Nan Ya black PVC and has a thickness of 0.10-2 mm The adhesive tape of the invention is applicable to Building Integrated Photovoltaic (BIPV), as well as the photovoltaic assemblies which do not need an aluminum frame, such as roof photovoltaic, photovoltaic street lamps or the like. For example, the adhesive tape of the invention can be adhered to four edges of a solar assembly to form an edge-sealed structure. The foam adhesive in the adhering layer has a certain cushioning performance. The material for the protective layer has relatively good abrasion resistant performance and can block the moisture-vapor transmission effectively. The application of the inventive adhesive tape reduces the weight of the solar assemblies greatly, reduces the production time because curing time is not required, provides convenient operation for applying the adhesive tape, and reduces the manufacturing cost.

Example 1

The structure of the adhesive tape of example 1 was shown in FIG. 1. Both sides of a substrate layer 1 were provided with a film layer 4 and a releasing film 6, respectively. The materials for respective layers were as follows respectively:
the film layer 4: a 0.06 mm black PVC (polyvinyl chloride) film from Huasu
the substrate layer 1: a 2081 acrylic foam adhesive from 3M Company, USA
the releasing film 6: a 0.075 mm PE releasing film from Mitsubishi Chemical Corporation
The preparation process of the adhesive tape was as follows:
The 2081 acrylic foam adhesive from 3M Company was coated onto the 0.075 mm PE (polyethylene) releasing film from Mitsubishi Chemical Corporation by a solventless coating process to form a substrate layer. After the coating, the substrate layer was adhered to the inner surface of the 0.06 mm black PVC film from Huasu to obtain a finish adhesive tape.

Example 2

The structure of the adhesive tape of example 2 was shown in FIG. 2. Both sides of a substrate layer 1 were provided with a primer layer 5 and a releasing film 6 respectively, and a film layer 4 was provided on the primer layer 5. The materials for respective layers were as follows respectively:
the film layer: a 0.10 mm black PVC film from Huasu
the primer layer: "POLYMENT NK-350"
the substrate layer: a 2081 acrylic foam adhesive from 3M Company, USA
the releasing film: a 0.075 mm PP (polypropylene) releasing film from Mitsubishi Chemical Corporation
The preparation process of the adhesive tape was as follows:
The 2081 acrylic foam adhesive from 3M Company was coated onto the 0.075 mm PE releasing film from Mitsubishi Chemical Corporation by a solventless coating process to form a substrate layer. A primer layer was coated on the adhering layer of the 0.10 mm black PVC film from Huasu. After the coating, the substrate layer was adhered to the primer layer on the 0.10 mm black PVC film from Huasu to obtain a product.

Example 3

The structure of the adhesive tape of example 3 was shown in FIG. 3. Both sides of a substrate layer 1 were provided with a film layer 4 and a releasing film 6 respectively, and a top layer 7 was provided on the film layer 4. The materials for respective layers were as follows respectively:
the top layer: "MOMENTIVE PERFORMANCE MATERIALS "UVHC8558".
the film layer: a 0.10 mm black PVC film from Huasu
the substrate layer: a 2081 acrylic foam adhesive from 3M Company, USA
the releasing film: a 0.150 mm PE releasing film from Tongli
The preparation process of the adhesive tape was as follows:
The 2081 acrylic foam adhesive from 3M Company was coated onto the 0.150 mm PE releasing film from Tongli by a solventless coating process to form a substrate layer. A bottom surface solidifying layer of MOMENTIVE PERFORMANCE MATERIALS "UVHC8558". was coated on the outer surface layer of the 0.10 mm black PVC film from Huasu. After the coating, the substrate layer was adhered to the inner surface of the 0.10 mm black PVC film from Huasu to obtain a product.

Example 4

The structure of the adhesive tape of example 4 was shown in FIG. 4. The materials for respective layers were as follows respectively:
the top layer 7: MOMENTIVE PERFORMANCE MATERIALS "UVHC8558".
the film layer 4: a 0.10 mm black PVC film from Huasu
the primer layer 5: 3M "ADHESION PROMOTER N-200" primer coating agent
the substrate layer 1: 3M "SOLAR ACRYLIC FOAM TAPE FB80" from 3M Company, USA
the releasing film 6: a 0.150 mm PE releasing film from Tongli
The preparation process of the adhesive tape was as follows:
The 3M FB80 acrylic foam adhesive from 3M Company was coated onto the 0.150 mm PE releasing film from Tongli by a solventless coating process to form a substrate layer. A cured layer of MOMENTIVE PERFORMANCE MATERIALS "UVHC8558" was coated on the outer surface layer of the 0.10 mm black PVC film from Huasu. Then the 3M "ADHESION PROMOTER N-200" primer coating agent was coated on the inner surface of the 0.10 mm black PVC film from Huasu. After the coating, the substrate layer was adhered to the 0.10 mm black PVC film from Huasu to obtain a product.

Example 5

The structure of the adhesive tape of example 5 was shown in FIG. 5. The materials for respective layers were as follows respectively:
the film layer 4: a Renolit 0.10 mm black PVC film
the third adhesive layer 9: a CSA3050 acrylic adhesive from 3M
the intermediate layer 8: a 8011 aluminum foil from Alcoa
the substrate layer 1: a 2081 acrylic foam adhesive from 3M Company, USA
the releasing film 6: a 0.150 mm PE releasing film from Tongli
The preparation process of the adhesive tape was as follows:
The 2081 acrylic foam adhesive from 3M Company was coated onto the 0.150 mm PE releasing film from Tongli by a solventless coating process to form a substrate layer, and the other side thereof was adhered with the 8011 aluminum foil from Alcoa to obtain a half-finished product I. The inner surface layer of the 0.10 mm black PVC film from Huasu was the CSA3050 adhesive from 3M to obtain a half-finished product II. The half-finished product I was adhered to the half-finished product II to obtain a product.

Example 6

The structure of the adhesive tape of example 6 was shown in FIG. 6. The materials for respective layers were as follows respectively:
the film layer 4: a Renolit 0.10 mm black PVC film
the third adhesive layer 9: a CSA3050 acrylic adhesive from 3M
the intermediate layer 8: a 0.05 mm transparent PET film from Yihua Toray
the substrate layer 1: a 2081 acrylic foam adhesive from 3M Company, USA
the releasing film 6: a 0.150 mm PE releasing film from Tongli The preparation process of the adhesive tape was as follows:

The 2081 acrylic foam adhesive from 3M Company was coated onto the 0.150 mm PE releasing film from Tongli by a solventless coating process to form a substrate layer, and the other side thereof was adhered with the 0.05 mm transparent PET film from Yihua Toray to obtain a half-finished product I. The inner surface layer of the 0.10 mm black PVC film from Huasu was the CSA3050 adhesive from 3M to obtain a half-finished product II. The half-finished product I was adhered to the half-finished product II to obtain a product.

Example 7

The structure of the adhesive tape of example 7 was shown in FIG. 7. The materials for respective layers were as follows respectively:
the top layer 7: MOMENTIVE PERFORMANCE MATERIALS "UVHC8558".
the film layer 4: a 0.10 mm black PVC film from NAN YA
the third adhesive layer 9: a CSA3050 acrylic adhesive from 3M
the intermediate layer 8: a 8011 aluminum foil from Alcoa
the substrate layer 1: a 2081 acrylic foam adhesive from 3M Company, USA
the releasing film 6: a 0.150 mm PE releasing film from Tongli The preparation process of the adhesive tape was as follows:

The 0.150 mm PE releasing film from Tongli was coated with the 2081 acrylic foam adhesive from 3M Company by a solventless coating process, and the other side thereof was adhered with the 8011 aluminum foil from Alcoa to obtain a half-finished product I. The 0.10 mm black PVC film from NAN YA was coated with the MOMENTIVE PERFORMANCE MATERIALS "UVHC8558". hardening coating on the outer surface thereof and the CSA3050 adhesive from 3M on the inner surface thereof to obtain a half-finished product II. The half-finished product I was adhered to the half-finished product II to obtain a product.

Example 8

The structure of the adhesive tape of example 8 was shown in FIG. 8. The materials for respective layers were as follows respectively:
the top layer 7: MOMENTIVE PERFORMANCE MATERIALS "UVHC8558".
the film layer 4: a 0.10 mm black PVC film from NAN YA
the third adhesive layer 9: a CSA3050 acrylic adhesive from 3M
the intermediate layer 8: a 0.05 mm transparent PET film from Yihua Toray
the substrate layer 1: a 2081 acrylic foam adhesive from 3M Company, USA
the releasing film 6: a 0.150 mm PE releasing film from Tongli The preparation process of the adhesive tape was as follows:

The 0.150 mm PE releasing film from Tongli was coated with the 2081 acrylic foam adhesive from 3M Company by a solventless coating process to form a substrate layer, and the other side thereof was adhered with the 0.05 mm transparent PET film from Yihua Toray to obtain a half-finished product I. The 0.10 mm black PVC film from NAN YA was coated with the MOMENTIVE PERFORMANCE MATERIALS "UVHC8558" hardening coating on the outer surface thereof and the CSA3050 adhesive from 3M on the inner surface thereof to obtain a half-finished product II. The half-finished product I was adhered to the half-finished product II to obtain a product.

Example 9

The structure of the adhesive tape of example 9 was shown in FIG. 9. The materials for respective layers were as follows respectively:
the film layer 4: a 0.10 mm black PVC film from NAN YA
the primer layer 5: 3M "ADHESION PROMOTER N-200" primer coating agent
the third adhesive layer 9: a CSA3050 acrylic adhesive from 3M
the intermediate layer 8: a 8011 aluminum foil from Alcoa
the substrate layer 1: a 2081 acrylic foam adhesive from 3M Company, USA
the releasing film 6: a 0.150 mm PE releasing film from Tongli The preparation process of the adhesive tape was as follows:

The 0.150 mm PE releasing film from Tongli was coated with the 2081 acrylic foam adhesive from 3M Company by a solventless coating process to form a substrate layer, and the other side thereof was adhered with the 8011 aluminum foil from Alcoa to obtain a half-finished product I. The inner surface layer of the 0.10 mm black PVC film from NAN YA was firstly coated with the 3M "ADHESION PROMOTER N-200" primer coating agent and then the CSA3050 adhesive from 3M to obtain a half-finished product II. The half-finished product I was adhered to the half-finished product II to obtain a product.

Example 10

The structure of the adhesive tape of example 10 was shown in FIG. 10. The materials for respective layers were as follows respectively:
the film layer 4: a 0.10 mm black PVC film from NAN YA
the primer layer 5: 3M "ADHESION PROMOTER N-200" primer coating agent
the third adhesive layer 9: a CSA3050 acrylic adhesive from 3M
the intermediate layer 8: a 0.05 mm transparent PET film from Yihua Toray
the substrate layer 1: a 2081 acrylic foam adhesive from 3M Company, USA the releasing film 6: a 0.150 mm PE releasing film from Tongli The preparation process of the adhesive tape was as follows:

The 0.150 mm PE releasing film from Tongli was coated with the 2081 acrylic foam adhesive from 3M Company by a solventless coating process to form a substrate layer, and the other side thereof was adhered with the 0.05 mm transparent PET film from Yihua Toray to obtain a half-finished product I. The inner surface layer of the 0.10 mm black PVC film from NAN YA was firstly coated with the 3M "ADHESION PROMOTER N-200" primer coating agent and then the CSA3050 adhesive from 3M to obtain a half-finished product II. The half-finished product I was adhered to the half-finished product II to obtain a product.

Example 11

The structure of the adhesive tape of example 11 was shown in FIG. 11. The materials for respective layers were as follows respectively:
the top layer 7: MOMENTIVE PERFORMANCE MATERIALS "UVHC8558".
the film layer 4: a 0.10 mm black PVC film from NAN YA
the primer layer 5: a 3M "ADHESION PROMOTER N-200" primer coating agent
the third adhesive layer 9: a CSA3050 acrylic adhesive from 3M
the intermediate layer 8: a 8011 aluminum foil from Alcoa
the substrate layer 1: a 2081 acrylic foam adhesive from 3M Company, USA
the releasing film 6: a 0.150 mm PE releasing film from Tongli The preparation process of the adhesive tape was as follows:

The 0.150 mm PE releasing film from Tongli was coated with the 2081 acrylic foam adhesive from 3M Company by a solventless coating process to form a substrate layer, and the other side thereof was adhered with the 8011 aluminum foil from Alcoa to obtain a half-finished product I. The 0.10 mm black PVC film from NAN YA was coated with the MOMENTIVE PERFORMANCE MATERIALS "UVHC8558" hardening coating on the outer surface thereof, and the inner surface thereof was firstly coated with the 3M "ADHESION PROMOTER N-200" primer coating agent and then the CSA3050 adhesive from 3M to obtain a half-finished product II. The half-finished product I was adhered to the half-finished product II to obtain a product.

Example 12

The structure of the adhesive tape of example 12 was shown in FIG. 12. The materials for respective layers were as follows respectively:
the top layer 7: MOMENTIVE PERFORMANCE MATERIALS "UVHC8558"
the film layer 4: a 0.10 mm black PVC film from NAN YA
the primer layer 5: a 3M "ADHESION PROMOTER N-200" primer coating agent
the third adhesive layer 9: a CSA3050 acrylic adhesive from 3M
the intermediate layer 8: a 0.05 mm transparent PET film from Yihua Toray
the substrate layer 1: a 2081 acrylic foam adhesive from 3M Company, USA
the releasing film 6: a 0.150 mm PE releasing film from Tongli The preparation process of the adhesive tape was as follows:

The 0.150 mm PE releasing film from Tongli was coated with the 2081 acrylic foam adhesive from 3M Company by a solventless coating process to form a substrate layer, and the other side thereof was adhered with the 0.05 mm transparent PET film from Yihua Toray to obtain a half-finished product I. The 0.10 mm black PVC film from NAN YA was coated with the MOMENTIVE PERFORMANCE MATERIALS "UVHC8558" hardening coating on the outer surface thereof, and the inner surface thereof was firstly coated with the 3M "ADHESION PROMOTER N-200" primer coating agent and then the CSA3050 adhesive from 3M to obtain a half-finished product II. The half-finished product I was adhered to the half-finished product II to obtain a product.

Example 13

The structure of the adhesive tape of example 13 was shown in FIG. 13. The materials for respective layers were as follows respectively:
the film layer 4: a 0.10 mm black PVC film from NAN YA
the first adhesive layer 2+the substrate layer 1+the second adhesive layer 3: a 4941 VHB adhesive tape from 3M
the releasing film 6: a 0.150 mm PE releasing film from Tongli The preparation process of the adhesive tape was as follows:

The first adhesive layer of the 4941 VHB adhesive tape from 3M was adhered to the 0.150 mm PE releasing film from Tongli, and the second adhesive layer thereof was adhered to the 0.10 mm black PVC film from NAN YA to obtain a product.

Example 14

The structure of the adhesive tape of example 14 was shown in FIG. 14. The materials for respective layers were as follows respectively:
the film layer 4: a 0.10 mm black PVC film from NAN YA
the primer layer 5: 3M "ADHESION PROMOTER N-200" primer coating agent
the first adhesive layer 2+the substrate layer 1+the second adhesive layer 3: a 4941 VHB adhesive tape from 3M
the releasing film 6: a 0.150 mm PE releasing film from Tongli The preparation process of the adhesive tape was as follows:

The first adhesive layer of the 4941 VHB adhesive tape from 3M was adhered to the 0.150 mm PE releasing film from Tongli, and the 0.10 mm black PVC film from NAN YA was firstly coated with the 3M "ADHESION PROMOTER N-200" primer coating agent on the inner surface thereof and then adhered to the second adhesive layer of the 4941 VHB adhesive tape from 3M to obtain a product.

Example 15

The structure of the adhesive tape of example 15 was shown in FIG. 15. The materials for respective layers were as follows respectively:
the top layer 7: MOMENTIVE PERFORMANCE MATERIALS "UVHC8558"
the film layer 4: a Renolit 0.10 mm black PVC film
the primer coating layer 5: a 3M "ADHESION PROMOTER N-200" primer coating agent the first adhesive layer 2+the substrate layer 1+the second adhesive layer 3: a 4941 VHB adhesive tape from 3M the releasing film: a 0.150 mm PE releasing film from Tongli The preparation process of the adhesive tape was as follows:

The first adhesive layer of the 4941 VHB adhesive tape from 3M was adhered to the 0.150 mm PE releasing film from Tongli. The 0.10 mm black PVC film from NAN YA was firstly coated with the MOMENTIVE PERFORMANCE MATERIALS "UVHC8558". hardening coating on the outer surface thereof and the 3M "ADHESION PROMOTER N-200" primer coating agent on the inner surface layer thereof, and then adhered to the second adhesive layer of the 4941 VHB adhesive tape from 3M to obtain a product.

Example 16

The structure of the adhesive tape of example 16 was shown in FIG. 16. The materials for respective layers were as follows respectively:
the film layer 4: a Renolit 0.10 mm black PVC film
the third adhesive layer 9: a CSA3060 acrylic adhesive from 3M
the intermediate layer 8: a 8011 aluminum foil from Alcoa
the first adhesive layer 2+the substrate layer 1+the second adhesive layer 3: a 4941 VHB adhesive tape from 3M
the releasing film 6: a 0.150 mm PE releasing film from Tongli The preparation process of the adhesive tape was as follows:

The first adhesive layer of the 4941 VHB adhesive tape from 3M was adhered to the 0.150 mm PE releasing film from Tongli and the second adhesive layer thereof was adhered to one surface of the 8011 aluminum foil from Alcoa to obtain a half-finished product I. The CSA3060 adhesive from 3M was coated on the inner surface of the 0.10 mm black PVC film from NAN YA to obtain a half-finished product II. The other surface situated on the aluminum foil of the half-finished product I was adhered to the adhesive coated surface of the half-finished product II to obtain a product.

Example 17

The structure of the adhesive tape of example 17 was shown in FIG. 17. The materials for respective layers were as follows respectively:
the film layer 4: a Renolit 0.10 mm black PVC film
the third adhesive layer 9: a CSA3060 acrylic adhesive from 3M
the intermediate layer 8: a 0.05 mm transparent PET film from Dahua
the first adhesive layer 2+the substrate layer 1+the second adhesive layer 3: a 4941 VHB adhesive tape from 3M
the releasing film 6: a 0.150 mm PE releasing film from Tongli The preparation process of the adhesive tape was as follows:

The first adhesive layer of the 4941 VHB adhesive tape from 3M was adhered to the 0.150 mm PE releasing film from Tongli and the second adhesive layer thereof was adhered to one surface of a 0.05 mm transparent PET film from Dahua to obtain a half-finished product I. The CSA3060 adhesive from 3M was coated on the inner surface of the 0.10 mm black PVC film from NAN YA to obtain a half-finished product II. The other surface situated on the PET film of the half-finished product I was adhered to the adhesive coated surface of the half-finished product II to obtain a product.

Example 18

The structure of the adhesive tape of example 18 was shown in FIG. 18. The materials for respective layers were as follows respectively:
the film layer 4: a Renolit 0.10 mm black PVC film
the primer layer 5: a 3M "ADHESION PROMOTER N-200" primer coating agent
the third adhesive layer 9: a CSA3060 acrylic adhesive from 3M
the intermediate layer 8: a 8011 aluminum foil from Alcoa
the first adhesive layer 2+the substrate layer 1+the second adhesive layer 3: a 4941 VHB adhesive tape from 3M
the releasing film 6: a 0.150 mm PE releasing film from Tongli The preparation process of the adhesive tape was as follows:

The first adhesive layer of the 4941 VHB adhesive tape from 3M was adhered to the 0.150 mm PE releasing film from Tongli and the second adhesive layer thereof was adhered to one surface of the 8011 aluminum foil from Alcoa to obtain a half-finished product I. The inner surface layer of the 0.10 mm black PVC film from NAN YA was firstly coated with the 3M "ADHESION PROMOTER N-200" primer coating agent and then the CSA3060 adhesive from 3M to obtain a half-finished product II. The other surface situated on the aluminum foil of the half-finished product I was adhered to the adhesive coated surface of the half-finished product II to obtain a product.

Example 19

The structure of the adhesive tape of example 19 was shown in FIG. 19. The materials for respective layers were as follows respectively:
the film layer 4: a Renolit 0.10 mm black PVC film
the primer layer 5: a "POLYMENT NK-350" primer coating agent
the third adhesive layer 9: a CSA3060 acrylic adhesive from 3M
the intermediate layer 8: a 0.05 mm transparent PET film from Dahua
the first adhesive layer 2+the substrate layer 1+the second adhesive layer 3: a 4941 VHB adhesive tape from 3M
the releasing film 6: a 0.150 mm PE releasing film from Tongli The preparation process of the adhesive tape was as follows:

The first adhesive layer of the 4941 VHB adhesive tape from 3M was adhered to the 0.150 mm PE releasing film from Tongli and the second adhesive layer thereof was adhered to one surface of the 0.05 mm transparent PET film from Dahua to obtain a half-finished product I. The inner surface layer of the 0.10 mm black PVC film from NAN YA was firstly coated with the 3M "ADHESION PROMOTER N-200" primer coating agent and then the CSA3060 adhesive from 3M to obtain a half-finished product II. The other surface situated on the PET film of the half-finished product I was adhered to the adhesive coated surface of the half-finished product II to obtain a product.

Example 20

The structure of the adhesive tape of example 20 was shown in FIG. 20. The materials for respective layers were as follows respectively:
- the top layer 7: MOMENTIVE PERFORMANCE MATERIALS "UVHC8558"
- the film layer 4: a Renolit 0.10 mm black PVC film
- the third adhesive layer 9: a CSA3060 acrylic adhesive from 3M
- the intermediate layer 8: a 8011 aluminum foil from Alcoa
- the first adhesive layer 2+the substrate layer 1+the second adhesive layer 3: a 4941 VHB adhesive tape from 3M
- the releasing film 6: a 0.150 mm PE releasing film from Tongli The preparation process of the adhesive tape was as follows:

The first adhesive layer of the 4941 VHB adhesive tape from 3M was adhered to the 0.150 mm PE releasing film from Tongli and the second adhesive layer thereof was adhered to one surface of the 8011 aluminum foil from Alcoa to obtain a half-finished product I. The 0.10 mm black PVC film from NAN YA was firstly coated with the MOMENTIVE PERFORMANCE MATERIALS "UVHC8558". hardening coating on the outer surface thereof and the CSA3060 adhesive from 3M on the inner surface layer thereof to obtain a half-finished product II. The other surface situated on the aluminum foil of the half-finished product I was adhered to the adhesive coated surface of the half-finished product II to obtain a product.

Example 21

The structure of the adhesive tape of example 21 was shown in FIG. 21. The materials for respective layers were as follows respectively:
- the top layer 7: MOMENTIVE PERFORMANCE MATERIALS "UVHC8558"
- the film layer 4: a 0.10 mm black PVC film from NAN YA
- the third adhesive layer 9: a CSA3060 acrylic adhesive from 3M
- the intermediate layer 8: a 0.05 mm transparent PET film from Dahua
- the first adhesive layer 2+the substrate layer 1+the second adhesive layer 3: a 4941 VHB adhesive tape from 3M
- the releasing film 6: a 0.150 mm PE releasing film from Tongli The preparation process of the adhesive tape was as follows:

The first adhesive layer of the 4941 VHB adhesive tape from 3M was adhered to the 0.150 mm PE releasing film from Tongli and the second adhesive layer thereof was adhered to one surface of the 0.05 mm transparent PET film from Dahua to obtain a half-finished product I. The 0.10 mm black PVC film from NAN YA was coated with the MOMENTIVE PERFORMANCE MATERIALS "UVHC8558" hardening coating on the outer surface thereof and the CSA3060 adhesive from 3M on the inner surface layer thereof to obtain a half-finished product II. The other surface situated on the PET film of the half-finished product I was adhered to the adhesive coated surface of the half-finished product II to obtain a product.

Example 22

The structure of the adhesive tape of example 22 was shown in FIG. 22. The materials for respective layers were as follows respectively:
- the top layer 7: MOMENTIVE PERFORMANCE MATERIALS "UVHC8558"
- the film layer 4: a Renolit 0.10 mm black PVC film
- the primer layer 5: a "POLYMENT NK-350" primer coating agent
- the third adhesive layer 9: a CSA3060 acrylic adhesive from 3M
- the intermediate layer 8: a 8011 aluminum foil from Alcoa
- the first adhesive layer 2+the substrate layer 1+the second adhesive layer 3: a 4941 VHB adhesive tape from 3M
- the releasing film 6: a 0.150 mm PE releasing film from Tongli The preparation process of the adhesive tape was as follows:

The first adhesive layer of the 4941 VHB adhesive tape from 3M was adhered to the 0.150 mm PE releasing film from Tongli and the second adhesive layer thereof was adhered to one surface of the 8011 aluminum foil from Alcoa to obtain a half-finished product I. The 0.10 mm black PVC film from NAN YA was coated with the MOMENTIVE PERFORMANCE MATERIALS "UVHC8558" hardening coating on the outer surface thereof, and the inner surface thereof was firstly coated with the 3M "ADHESION PROMOTER N-200" primer coating agent and then the CSA3050 adhesive from 3M to obtain a half-finished product II. The other surface situated on the aluminum foil of the half-finished product I was adhered to the adhesive coated surface of the half-finished product II to obtain a product.

Example 23

The structure of the adhesive tape of example 23 was shown in FIG. 23. The materials for respective layers were as follows respectively:
- the top layer 7: MOMENTIVE PERFORMANCE MATERIALS "UVHC8558"
- the film layer 4: a Renolit 0.10 mm black PVC film
- the primer layer 5: a "POLYMENT NK-350" primer coating agent
- the third adhesive layer 9: a CSA3060 acrylic adhesive from 3M
- the intermediate layer 8: a 0.05 mm PET film from Mitsubishi Chemical Corporation
- the first adhesive layer 2+the substrate layer 1+the second adhesive layer 3: a 4941 VHB adhesive tape from 3M
- the releasing film 6: a 0.150 mm PE releasing film from Tongli The preparation process of the adhesive tape was as follows:

The first adhesive layer of the 4941 VHB adhesive tape from 3M was adhered to the 0.150 mm PE releasing film from Tongli and the second adhesive layer thereof was adhered to one surface of the 0.05 mm transparent PET film from Dahua to obtain a half-finished product I. The 0.10 mm black PVC film from NAN YA was coated with the MOMENTIVE PERFORMANCE MATERIALS "UVHC8558" hardening coating on the outer surface thereof, and the inner surface thereof was firstly coated with the 3M "ADHESION PROMOTER N-200" primer coating agent and then the CSA3050 adhesive from 3M to obtain a half-finished product II. The other surface situated on the PET film of the half-finished product I was adhered to the adhesive coated surface of the half-finished product II to obtain a product.

Example 24

The structure of the adhesive tape of example 24 is shown in FIG. 24. Commercial 32 mils (0.8 mm) "3M SEMI- TRANSPARENT MATERIAL RIVET TACKY TAPE SEAL 4422B" (3M/Sumitomo, Japan) was used as is for this example.

The tape consists of 3 layers:
the film layer 4: 6 mils thick (0.15 mm), ionomer/acrylic
the substrate layer 1: 24 mils thick (0.6 mm), very conformable multi-purpose acrylic
the releasing film 6: 2 mils thick (0.05 mm) polyester film The glass surfaces of the photo energy assembly were primed with "3M SILANE GLASS TREATMENT AP115" (3M Company, St. Paul, Minn.) and the polyester backsheet surface of the photo energy assembly was primed with "3M TAPE PRIMER 94" (3M Company, St. Paul, Minn.).

Testing:

Test on the Protective Layer and the Water-Proof Intermediate Layer:

The materials of the protective layers in Examples 1-24 all passed the following tests according to IEC61215: at least 200 cycles for the high-low temperature cycle at −40° C.-+85° C.; at least 10 cycles for the humidity freeze cycle at −40° C.-+85° C./85% RH; and at least 1000 hours for the high temperature-high humidity aging at +85° C./85% RH.

The materials of the water-proof intermediate layers in Examples 1-24 all passed the creepage test according to IEC61215 after being subjected to 10 times for the humidity freeze cycle at −40° C.-+85° C. /85% relative humidity according to IEC61215; 1000 hours for the high temperature-high humidity aging at +85° C./85% relative humidity.

Test on the Adhesive Tapes:

The test for weather resistance was performed according to the IEC 61215. In the above examples, the following aging test was carried out for 1000 hours according to the IEC 61215: aging in 85% humidity 85°C., UV Irradiation 15 Kwh/m² aging, 200 thermal cycles and 10 humidity freeze cycles. The results indicated that there was no crack and surface failure observed in the adhesive tapes before and after aging. The 90 degree peel strengths were not less than 1 N/cm.

The testing results for respective examples are summarized in the following table:

| Aging test | Peeling force > 1 N/cm All examples | No crack or aging in the outer film All examples |
| --- | --- | --- |
| non-aged | Pass | Pass |
| Humid heat aging DH1000 | Pass | Pass |
| UVaging UV | Pass | Pass |
| Humidity freezing aging HF10 | Pass | Pass |
| Thenual circle aging TC200 | Pass | Pass |

It can be seen from the testing data listed in the table that all samples in the examples passed the respective tests.

What is claimed is:

1. A frameless photo-energy assembly including a photo-energy converter, wherein an edge of the photo-energy converter is sealed by an adhesive tape;
   wherein the adhesive tape comprises:
      an adhering layer, which is used to contact the edge of the photo-energy converter and comprises:
         a substrate layer;
         optionally, a first adhesive layer situated on a side of the substrate layer wherein the first adhesive layer is used to contact the photo-energy converter; and
         an optional second adhesive layer situated on the substrate layer, on the opposite side of the first adhesive layer, if the first adhesive layer present,
      an aging-resistant protective layer on the adhering layer comprising:
         an optional primer layer, which is situated on the adhering layer; and
         a film layer, which is arranged on:
            the primer layer, if the primer layer is present; or
            the substrate layer, provided that the primer layer and the first and second adhesive layers are not present; or
            the second adhesive layer, if present, and provided that the primer layer is not present, and
         a water-proof intermediate layer, which is situated between the second adhesive layer, if present, or the substrate if the second adhesive layer is not present, and the aging-resistant protective layer,
   wherein the water-proof intermediate layer is made of material selected from the group consisting of a metal, a rubber, polyurethane, and combinations thereof.

2. The frameless photo-energy assembly as claimed in claim 1, wherein the second adhesive layer is not present.

3. The frameless photo-energy assembly as claimed in claim 1, wherein the substrate layer is made of a material selected from the group consisting of a foaming material, an acrylic resin, polyurethane, a polyethylene rubber, a non-woven material, or mixtures thereof.

4. The frameless photo-energy assembly as claimed in claim 1, wherein the first adhesive layer is made of an adhesive selected from the group consisting of an acrylic adhesive, a hot melt adhesive, a structural adhesive, or combinations thereof.

5. The frameless photo-energy assembly as claimed in claim 1, wherein the second adhesive layer is made of an adhesive selected from the group consisting of an acrylic adhesive, a silicon based adhesive, a rubber adhesive, a hot melt adhesive, a structural adhesive, or combinations thereof.

6. The frameless photo-energy assembly as claimed in claim 2, wherein the substrate layer is made of a foaming material and the film layer comprises polyvinyl chloride.

7. The frameless photo-energy assembly as claimed in claim 1, wherein the metal is selected from the group consisting of aluminum, copper or combinations thereof.

8. The frameless photo-energy assembly as claimed in claim 1, wherein the rubber is selected from the group consisting of ethylene propylene terpolymer, fluoroelastomer, polyisobutylene, or mixtures thereof.

9. The frameless photo-energy assembly as claimed in claim 1, wherein the film layer is made of a material selected from the group consisting of polyvinyl chloride, polypropylene, polyethylene, polytetrafluoroethylene, nylon, ionomer, or mixtures thereof.

10. The frameless photo-energy assembly as claimed in claim 1, wherein the primer layer is made of a material selected from the group consisting of polyvinyl chloride, polypropylene, polyvinyl, polytetrafluoroethylene, nylon or metal foil.

11. The frameless photo-energy assembly as claimed in claim 1, wherein the primer layer further contain a third adhesive layer which is situated at a side of the primer layer adjacent to the substrate layer, wherein the third adhesive is selected from the group consisting of an acrylic adhesive, a hot melt adhesive, a structural adhesive, a silicon based adhesive, or combinations thereof.

12. The frameless photo-energy assembly as claimed in claim 1, wherein the film layer further comprises a top layer selected from the group consisting of an abrasion resistant coating, a weather resistant coating, a water-proof coating, a soiling resistant coating, or a decorating coating.

13. The frameless photo-energy assembly as claimed in claim 1, wherein the adhesive layer of the adhering layer is an acrylic adhesive layer and the substrate layer of the adhering layer is made of acrylic foam.

14. The frameless photo-energy assembly as claimed in claim 1, wherein the protective layer includes a primer layer and a film layer, and the film layer is made of black PVC.

15. The frameless photo-energy assembly as claimed in claim 1, wherein the water-proof intermediate layer and the adhesive tape can pass the creepage test after being subjected to 10 cycles for the humidity freeze cycle at −40° to 85° C. and 85% relative humidity according to IEC61215; 1000 hours for the high temperature-high humidity aging at 85° C. and 85% relative humidity according to IEC61215.

16. The frameless photo-energy assembly as claimed in claim 15, wherein the water-proof intermediate layer is made of an aluminum foil.

17. The frameless photo-energy assembly as claimed in claim 1, wherein the substrate layer is made of a foam adhesive.

18. The frameless photo-energy assembly as claimed in claim 17, which does not contain the first adhesive layer and the second adhesive layer.

19. The frameless photo-energy assembly as claimed in claim 1, which is an assembly selected from the group consisting of a photovoltaic panel, a thin film photovoltaic panel, and a photothermal panel.

20. A solar article with the photo-energy assembly according to claim 1, wherein the article is selected from the group consisting of a solar vehicle, a solar water heater, a solar street lamp, and a solar curtain wall.

* * * * *

UNITED STATES PATENT AND TRADEMARK OFFICE
CERTIFICATE OF CORRECTION

PATENT NO.        : 10,026,858 B2
APPLICATION NO.   : 15/330948
DATED             : July 17, 2018
INVENTOR(S)       : Eric Li Page 1 of 1

It is certified that error appears in the above-identified patent and that said Letters Patent is hereby corrected as shown below:

In the Specification

Column 1,
Line 20 (approx.), delete "scaling" and insert -- sealing --, therefor.

Column 2,
Line 34-35, delete "scaling," and insert -- sealing, --, therefor.

Column 3,
Line 1, delete "scction" and insert -- section --, therefor.

Column 4,
Line 7, delete "Sc2," and insert -- Se2, --, therefor.

Column 7,
Line 40, delete "THY" and insert -- THV --, therefor.

Column 19,
Line 50 (approx.), delete "Thenual" and insert -- Thermal --, therefor.

Signed and Sealed this
Sixteenth Day of April, 2019

Andrei Iancu
*Director of the United States Patent and Trademark Office*